(12) United States Patent
Su et al.

(10) Patent No.: US 6,265,768 B1
(45) Date of Patent: Jul. 24, 2001

(54) CHIP SCALE PACKAGE

(75) Inventors: Ching-Huei Su; Su Tao, both of Kaohsiung (TW)

(73) Assignee: Advanced Semiconductor Engineering, Inc. (TW)

(*) Notice: Subject to any disclaimer, the term of this patent is extended or adjusted under 35 U.S.C. 154(b) by 0 days.

(21) Appl. No.: 09/494,648

(22) Filed: Jan. 31, 2000

(51) Int. Cl.[7] .................. H01L 23/06; H01L 23/48; H01L 29/40; H01L 23/52; H01L 23/29
(52) U.S. Cl. .................. 257/684; 257/693; 257/729; 257/778; 257/789; 257/790; 257/795
(58) Field of Search ....................... 257/684, 693, 257/729, 778, 789, 790, 795

(56) References Cited

U.S. PATENT DOCUMENTS

| 5,216,278 | * | 6/1993 | Lin et al. | |
|---|---|---|---|---|
| 5,640,047 | * | 6/1997 | Nakashima. | |
| 5,866,949 | | 2/1999 | Schueller | 257/778 |
| 6,013,946 | | 1/2000 | Lee et al. | 257/684 |

FOREIGN PATENT DOCUMENTS

7321244 * 12/1995 (JP).

* cited by examiner

Primary Examiner—David E. Graybill

(57) ABSTRACT

A chip scale package mainly comprises a semiconductor chip disposed on an upper surface of a substrate and sealed by a package body. The package body comprises a resin base material divided into a first region and a second region. The resin base material contains a plurality of filler particles having the percentage by weight of the filler particles in the first and second regions being different. Thus, in accordance with the present invention, the package provides better buffering effect for stresses due to CTE mismatch between the substrate and the chip, and significantly reduces the moisture from surrounding diffusing into the package thereby reducing the problems of delamination or die-cracking.

14 Claims, 3 Drawing Sheets

CHIP SCALE PACKAGE

BACKGROUND OF THE INVENTION

1 Field of the Invention

This invention relates to a chip scale package, and more specifically to a package body for use in encapsulating a semiconductor chip disposed on a substrate.

2. Description of the Related Art

FIGS. 1–3 illustrates three prior art chip scale packages. Typically a chip scale package comprises a semiconductor chip 110 disposed on the upper surface of a substrate 130 through an elastomer 120, and a package body 150 for providing environmental sealing and electrical insulation for the semiconductor chip 110. The package body 150 generally comprises a single layer structure formed of epoxy based material.

Normally, the semiconductor chip is formed of microcrystalline silicon with a coefficient of thermal expansion (CTE) of 3–5 ppm $°C.^{-1}$ and the substrate is usually formed of polymer having a coefficient of thermal expansion of 20–30 ppm $°C.^{-1}$. Since there is a significant difference between the semiconductor chip 110 and the substrate 130 in CTE, the semiconductor chip 110 and the substrate 130 expand and contract in different amounts along with temperature fluctuations. This imposes both shear and bend stresses on the package body 150. Moreover, due to the flexible nature of the substrate, the substrate tends to warp or bend during packaging process and temperature fluctuations. This greatly magnifies the problems associated with the destructive stresses imposed on the package body 150. And when the warpaged chip scale package is subject to pressure cook test (PCT) or other reliability tests, problems of peeling, delaminatoin or die cracking easily occur.

SUMMARY OF THE INVENTION

It is a primary object of the present invention to provide a chip scale package comprising a semiconductor chip disposed on a substrate wherein the semiconductor chip is sealed and electrically insulated by a package body comprising a multi-region structure, thereby reducing the problems of delamination or die-cracking.

The chip scale package according to a preferred embodiment of the present invention mainly comprises a semiconductor chip disposed on an upper surface of a substrate and sealed by a package body. The semiconductor chip has a plurality of bonding pads centrally formed on the active surface thereof. The substrate has a slot corresponding to the bonding pads of the semiconductor chip. The substrate is provided with a structure for making external electrical connection. And the bonding pads of the semiconductor chip are electrically connected to the structure for making external electrical connection.

The package body has a first portion formed on the upper surface of the substrate around the chip and a second portion formed within the slot of the substrate. The package body comprises a resin base material divided into a first region and a second region. The second region of the first portion of the package body is disposed between the first region of the package body and the substrate. And the first region of the second portion of the package body is disposed between the second region of the second portion of the package body and the substrate. The resin base material contains a plurality of filler particles wherein the percentage by weight of the filler particles in the first region of the package body is smaller than that of the second region of the package body. Since the CTE of the filler particles is smaller than that of the resin base material, the CTE of the second region is smaller than that of the first region thereby buffering stresses due to CTE mismatch between the substrate and the chip. Besides, the content of the filler particles in the second region is larger; hence, the moisture from surrounding diffusing into the package is significantly reduced thereby reducing the problems of delamination or die-cracking.

The chip scale package according to another preferred embodiment of the present invention mainly comprises a semiconductor chip disposed on a upper surface of a substrate and sealed by a package body. The semiconductor chip has a plurality of bonding pads formed on two lateral sides of the active surface thereof. The substrate has at least two slots corresponding to the bonding pads of the semiconductor chip. The substrate is provided with a structure for making external electrical connection. And the bonding pads of the semiconductor chip are electrically connected to the structure for making external electrical connection.

The package body is formed on the upper surface of the substrate around the chip and fills the slots of the substrate. The package body comprises a resin base material divided into a first region and a second region wherein the second region is disposed between the first region and the substrate. The resin base material contains a plurality of filler particles wherein the percentage by weight of the filler particles in the first region of the package body is smaller than that of the second region of the package body. Since the CTE of the filler particles is smaller than that of the resin base material, the CTE of the second region is smaller than that of the first region thereby buffering stresses due to CTE mismatch between the substrate and the chip. Besides, the content of the filler particles in the second region is larger; hence, the moisture from surrounding diffusing into the package is significantly reduced thereby reducing the problems of delamination or die-cracking.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 1:
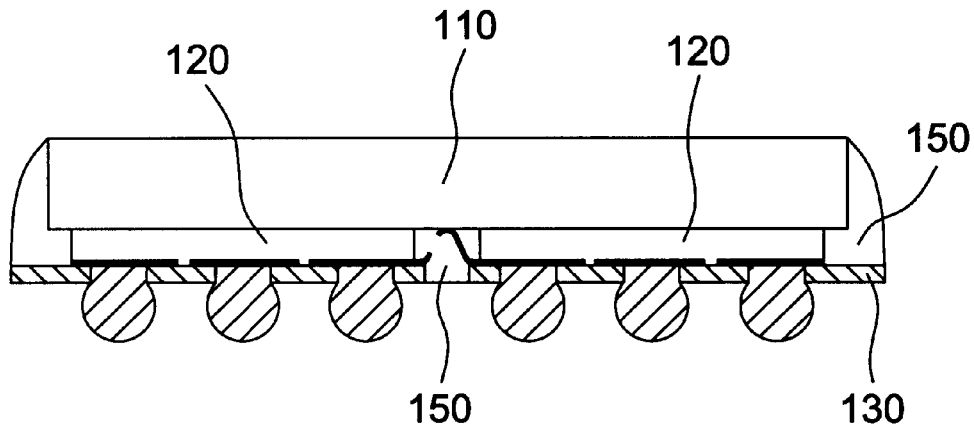
FIG. 1 is a cross-sectional view of a conventional chip scale package.
Figure 2:
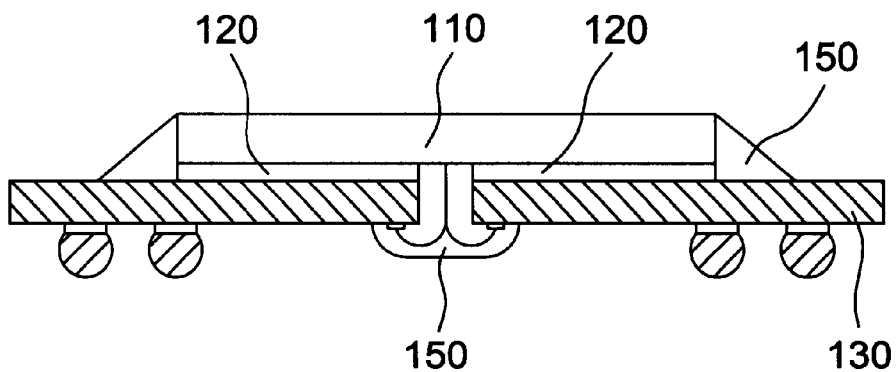
FIG. 2 is a cross-sectional view of another conventional chip scale package.
Figure 3:
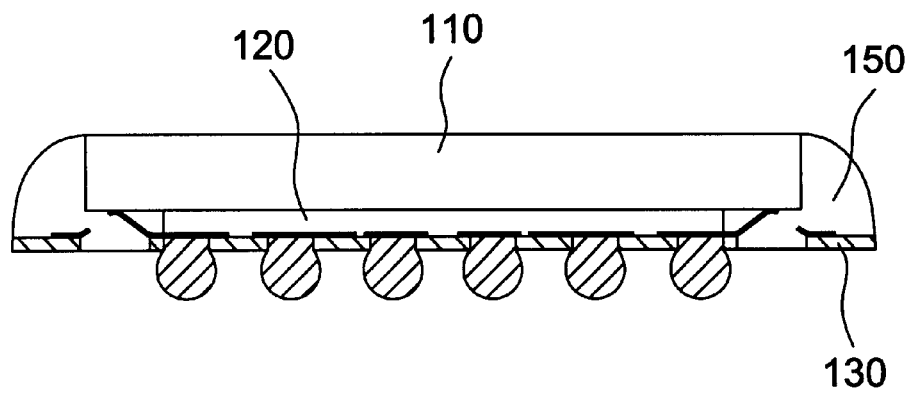
FIG. 3 is a cross-sectional view of still another conventional chip scale package.
Figure 4:
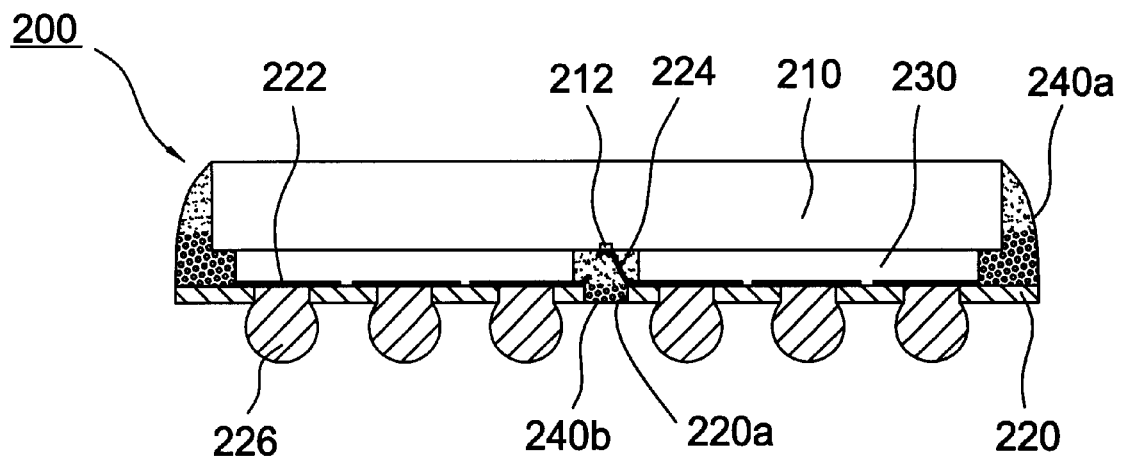
FIG. 4 is a cross-sectional view of a chip scale package according to a first embodiment of the present invention.

FIG. 4 discloses a chip scale package 200 according to a first embodiment of the present invention mainly comprising a semiconductor chip 210 disposed on an upper surface of a substrate 220. The semiconductor chip 210 has a plurality of bonding pads 212 centrally formed on the active surface thereof. The substrate 220 has a slot 220a corresponding to the bonding pads 212 of the semiconductor chip 210. The semiconductor chip 210 is attached onto the upper surface of the substrate 220 through an elastomer 230. The upper surface of the substrate 220 is provided with a plurality of solder pads 222 and leads 224. Each of the solder pads 222 is connected to one end of a corresponding lead 224 through conductive trace formed on the substrate 220. The other end of the lead 224 is electrically connected to a corresponding bonding pad 212 of the semiconductor chip 210. The substrate 220 has a plurality of through-holes formed corresponding to the solder pads 222. Each solder pad 222 is provided with a solder ball 226 for making external electrical connection.

Referring to FIG. 4 again, the chip scale package 200 in accordance with the present invention comprises a package body for protecting the package 200 against the external moisture and/or contamination. The package body includes a first portion 240a formed on the upper surface of the substrate 220 around the chip 210 and a second portion 240b formed within the slot 220a of the substrate 120 for sealing the leads 224. The package body comprises a resin base material, e.g., epoxy base material having a coefficient of thermal expansion of about 60 ppm $^{\circ}$ C.$^{-1}$, divided into a first region and a second region. The resin base material contains a plurality of filler particles (such as silica particles having a coefficient of thermal expansion of about 3 ppm $^{\circ}$ C.$^{-1}$ or polymer impregnated fiberglass particles) having the percentage by weight of the filler particles in the first and second regions being different. The second region of the first portion 240a of the package body is disposed between the first region of the first portion 240a of the package body and the substrate 220. And the first region of the second portion 240b of the package body is disposed between the second region of the second portion 240b of the package body and the substrate 220.

The package body is formed by (a) dispensing encapsulant (i.e., the resin base material containing filler particles) onto the to-be-sealed positions of the substrate, (b) precuring the encapsulant at a temperature of approximately 100–120° C. for about 30 minutes, and (c) postcuring the encapsulant at a temperature of approximately 170–180° C. for about 4 hours. During the precuring process, the semiconductor chip 210 of the package 200 is maintained above the substrate 220 such that a force, such as gravity, acts upon the encapsulant causing the filler particles to subside to form the first and second regions. As shown in FIG. 4, once the precuring process is completed, nearly all the filler particles reside within the second region of the package body. Preferably, the amount of the filler particles in the first region is about 5 to 10 percent by weight, and the amount of the filler particles in the second region is about 60 to 70 percent by weight. The precuring temperature and time may be adjusted to obtain a desired composition. The resin base material used in the present invention may also include suitable hardening agent, catalysts, dyes, etc. as are well known by those skilled in the art.

In a preferred embodiment, the first region of the package body contains 5 to 10 percent of silica particles by weight, and the second region of the package body contains 60 to 70 percent of silica particles by weight. Therefore, the first region of the package body has a coefficient of thermal expansion of about 60 ppm $^{\circ}$ C.$^{-1}$, and the second region of the package body has a coefficient of thermal expansion of about 25 ppm $^{\circ}$ C.$^{-1}$. Since the CTE of the second region is smaller than that of the first region, it helps to buffer stresses due to CTE mismatch between the substrate and the chip.

The content of the filler particles in the second region of first portion 240a of the package body is larger than that of the first region thereof. This provides better effect on preventing the moisture from penetrating through the interfaces between the chip 210 and the elastomer 230 as well as between the elastomer 230 and the substrate 220, thereby reducing the problems of delamination or die-cracking. Besides, the content of the filler particles in the second region of second portion 240b of the package body is larger than that of the first region thereof. This provides better effect on preventing the moisture from penetrating into the slot 220a of the substrate 220, thereby protecting the leads 224 from corrosion.

Figure 5:
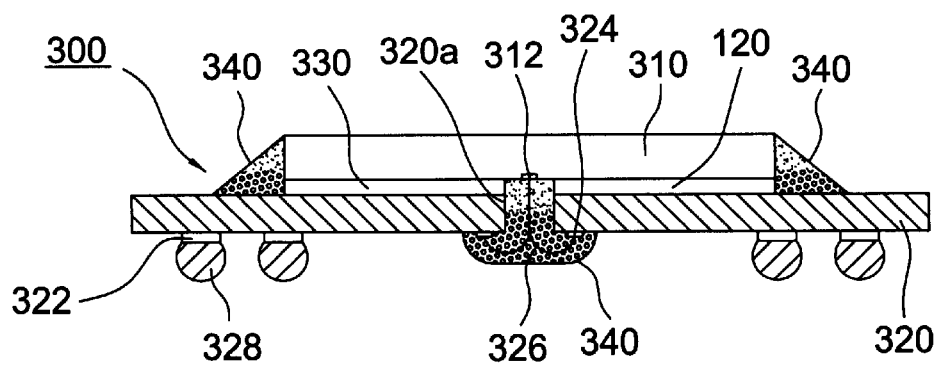
FIG. 5 is a cross-sectional view of a chip scale package according to a second embodiment of the present invention.

FIG. 5 discloses a chip scale package 300 according to a second embodiment of the present invention mainly comprising a semiconductor chip 310 disposed on an upper surface of a substrate 320. The semiconductor chip 310 has a plurality of bonding pads 312 centrally formed on the active surface thereof. The substrate 320 has a slot 320a corresponding to the bonding pads 312 of the semiconductor chip 310. The semiconductor chip 310 is attached onto the upper surface of the substrate 320 through an elastomer 330. The lower surface of the substrate 320 is provided with a plurality of solder pads 322 and chip connection pads 324. Each of the solder pads 322 is connected to one end of a corresponding chip connection pad 324 through conductive trace (not shown) formed in the substrate 320. The chip connection pads 324 of the substrate 320 are electrically connected the bonding pad 312 of the semiconductor chip 310 through a plurality of bonding wires 326. Each solder pad 322 is provided with a solder ball 326 for making external electrical connection.

Referring to FIG. 5 again, the chip scale package 300 in accordance with the present invention comprises a package body 340 for protecting the package 300 against the external moisture and/or contamination. The location and the composition of the package body 340 are substantially the same as those of the package body illustrated in FIG. 4.

Figure 6:
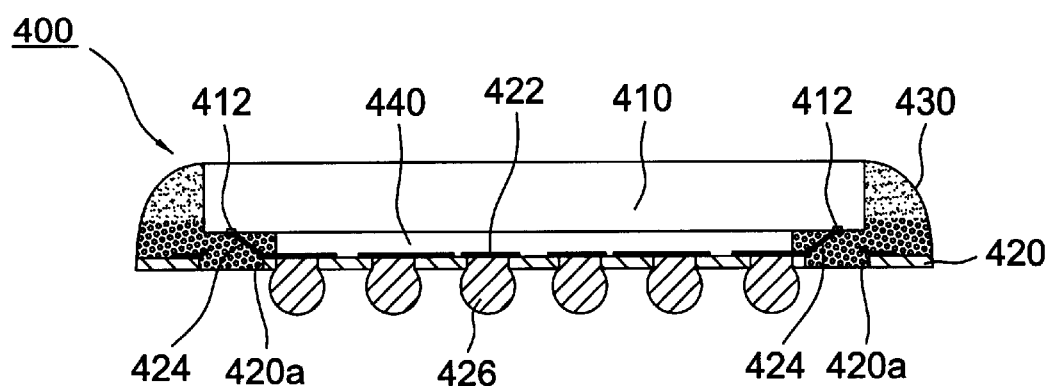
FIG. 6 is a cross-sectional view of a chip scale package according to a third embodiment of the present invention.

FIG. 6 discloses a chip scale package 400 according to a second embodiment of the present invention mainly comprising a semiconductor chip 410 disposed on an upper surface of a substrate 420 and sealed by a package body 430. The semiconductor chip 410 has a plurality of bonding pads 412 formed on two lateral sides of the active surface thereof. The substrate 420 has two slots 420a corresponding to the bonding pads 412 of the semiconductor chip 410. The semiconductor chip 410 is attached onto the upper surface of the substrate 420 through an elastomer 440. The upper surface of the substrate 420 is provided with a plurality of solder pads 422 and leads 424. Each of the solder pads 422 is connected to one end of a corresponding lead 424 through conductive trace formed on the substrate 420. The other end of the lead 424 is electrically connected to a corresponding bonding pad 412 of the semiconductor chip 410. The substrate 420 has a plurality of through-holes formed corresponding to the solder pads 422. Each solder pad 422 is provided with a solder ball 426 for making external electrical connection.

Referring to FIG. 6 again, the chip scale package 400 in accordance with the present invention comprises a package body 430 for protecting the package 300 against the external moisture and/or contamination. The package body 430 is formed on the upper surface of the substrate 420 around the chip 410 and fills the slots 420a of the substrate 420. The composition of the package body 430 is substantially the same as that of the package body illustrated in FIG. 4.

According to the chip scale package illustrated in the present invention, the package body comprises a resin base material divided into a first region and a second region. The resin base material contains a plurality of filler particles wherein the content of the filler particles in the first region of the package body is smaller than that of the second region of the package body. Since the content of the filler particles in the second region is larger; hence, the moisture from surrounding diffusing into the package is significantly reduced thereby reducing the problems of delamination or die-cracking and protecting leads from corrosion.

Moreover, since the resin base material has a better surface adhesion than the filler particles, the first region of the package body (mainly consisted of the resin base material) provides better adhesion to the semiconductor chip. Besides, the coefficient of thermal expansion of the resin base material is larger than that of the filler particles. Thus, the first region of the package body contract in larger amount than the second region thereof upon cooling to room temperature after encapsulation, thereby immobilizing the semiconductor chip more efficiently.

Although the invention has been explained in relation to its preferred embodiment, it is to be understood that many other possible modifications and variations can be made without departing from the spirit and scope of the invention as hereinafter claimed.

What is claimed is:

1. A chip scale package comprising:
   a substrate having an upper surface, a lower surface, and a slot defined therein, the substrate is provided with a structure for making external electrical connection;
   a semiconductor chip having a plurality of bonding pads centrally formed on the active surface thereof, the active surface of the semiconductor chip being attached to the upper surface of the substrate in a manner that the bonding pads thereof are corresponding to the slot of the substrate, the bonding pads of the semiconductor chip being electrically connected to the structure for making external electrical connection; and
   a package body having a first portion formed on the upper surface of the substrate around the chip and a second portion formed within the slot of the substrate, wherein the package body comprises a resin base material divided into a first region and a second region, and the resin base material contains a plurality of filler particles having the percentage by weight of the filler particles in the first and second regions being different.

2. The chip scale package as claimed in claim 1, wherein the second region of the first portion of the package body is disposed between the first region of the first portion of the package body and the substrate, and the first region of the second portion of the package body is disposed between the second region of the second portion of the package body and the substrate.

3. The chip scale package as claimed in claim 2, wherein the coefficient of thermal expansion of the first region is greater than the coefficient of thermal expansion of the second region.

4. The chip scale package as claimed in claim 2, wherein the amount of the filler particles in the second region is about 60 to 70 percent by weight.

5. The chip scale package as claimed in claim 4, wherein the amount of the filler particles in the first region is about 5 to 10 percent by weight.

6. The chip scale package as claimed in claim 1, wherein the filler particles comprise silica particles.

7. The chip scale package as claimed in claim 1, wherein the filler particles comprise polymer impregnated fiberglass particles.

8. A chip scale package comprising:
   a substrate having an upper surface, a lower surface, and at least two slots defined therein, the substrate is provided with a structure for making external electrical connection;
   a semiconductor chip having a plurality of bonding pads formed on two lateral sides of the active surface thereof, the active surface of the semiconductor chip being attached to the upper surface of the substrate in a manner that the bonding pads thereof are corresponding to the slots of the substrate, the bonding pads of the semiconductor chip being electrically connected to the structure for making external electrical connection; and
   a package body formed on the upper surface of the substrate around the chip and filling the slots of the substrate, wherein the package body comprises a resin base material divided into a first region and a second region, and the resin base material contains a plurality of filler particles having the percentage by weight of the filler particles in the first and second regions being different.

9. The chip scale package as claimed in claim 8, wherein the second region of the package body is substantially disposed between the first region of the package body and the substrate.

10. The chip scale package as claimed in claim 9, wherein the coefficient of thermal expansion of the first region is greater than the coefficient of thermal expansion of the second region.

11. The chip scale package as claimed in claim 9, wherein the amount of the filler particles in the second region is about 60 to 70 percent by weight.

12. The chip scale package as claimed in claim 11, wherein the amount of the filler particles in the first region is about 5 to 10 percent by weight.

13. The chip scale package as claimed in claim 8, wherein the filler particles comprise silica particles.

14. The chip scale package as claimed in claim 8, wherein the filler particles comprise polymer impregnated fiberglass particles.

* * * * *